United States Patent [19]
Van Den Crommenacker et al.

[11] Patent Number: 4,577,123
[45] Date of Patent: Mar. 18, 1986

[54] INTEGRATED LOGIC CIRCUIT HAVING COLLECTOR NODE WITH PULL-UP AND CLAMP

[75] Inventors: Johannes D. P. Van Den Crommenacker; Jan Lohstroh, both of Eindhoven, Netherlands

[73] Assignee: U.S. Philips Corporation, New York, N.Y.

[21] Appl. No.: 502,866

[22] Filed: Jun. 9, 1983

[30] Foreign Application Priority Data

Mar. 9, 1983 [NL] Netherlands ................. 8300843

[51] Int. Cl.$^4$ ................. H03K 19/013; H03K 19/091; H03K 5/08; H01L 29/70
[52] U.S. Cl. ..................... 307/446; 307/443; 307/458; 307/459; 307/551; 307/559; 307/303; 357/92
[58] Field of Search ............... 307/443, 446, 454, 457, 307/458, 459, 460, 477, 551, 559, 561, 303; 357/92

[56] References Cited

U.S. PATENT DOCUMENTS

| | | | |
|---|---|---|---|
| 3,987,310 | 10/1976 | Peltier et al. | 307/458 |
| 4,239,981 | 12/1980 | Crookshanks | 307/303 X |
| 4,288,805 | 9/1981 | Depey | 307/458 |
| 4,317,127 | 2/1982 | Nishizawa | 307/458 X |
| 4,450,468 | 5/1984 | Nishizawa et al. | 307/458 X |

FOREIGN PATENT DOCUMENTS 0054408 6/1982 European Pat. Off. ............ 307/458

OTHER PUBLICATIONS

Lohstroh et al., "Propagation Delay Times of ISL and STL"; *IEEE JSSC*, vol. SC-17, No. 4, pp. 687-695; 8/1982.
Lohstroh et al., "Temperature Behavior of the Voltage Swings and the Static Noise Margins of ISL and STL"; *IEEE-JSSC*, vol. SC-17, No. 4, pp. 677-686; 8/1982.
Bursky, "ISL Array Packs Nearly 1200 Gates Yet Handles 40-MHz Clocks"; *Electronic Design*, p. 131; 9/1/1979.

*Primary Examiner*—Larry N. Anagnos
*Attorney, Agent, or Firm*—Jack E. Haken; James J. Cannon, Jr.

[57] ABSTRACT

A logic circuit of the I$^2$L, the ISL or the STL type having a signal input formed by the control electrode of an inverter transistor and plural signal outputs each coupled through a diode to a main electrode of the inverter transistor, this main electrode being connected to a supply line through a pull-up connection. The improvement relates to a further connection path comprising a Schottky diode and a resistor which bridges the main current path of the inverter transistor and which reduces the voltage swing at the main electrode.

7 Claims, 5 Drawing Figures

INTEGRATED LOGIC CIRCUIT HAVING COLLECTOR NODE WITH PULL-UP AND CLAMP

BACKGROUND OF THE INVENTION

1. Field of the Invention

The invention relates to an integrated logic circuit having a signal input formed by a control electrode of a transistor and plural signal outputs each coupled through a diode to a first main electrode of the transistor, the signal input being connected to means for supplying current, which integrated logic circuit comprises a semiconductor body having a major surface located on an active side of the semiconductor body, a group of regions of a first conductivity type being present on this active side of the semiconductor body, which regions extend on a substrate region of a second conductivity type common to these regions, each of the regions of the first conductivity type being surrounded by an isolation zone which extends from the major surface into the semiconductor body and by means of which at least a number of these regions are isolated from each other at least during operation of the integrated logic circuit, in which a first region of the first conductivity type belonging to the group of regions forms part of the first main electrode of the transistor and the control electrode of the transistor has a surface zone of the second conductivity type which is situated inside the isolation zone surrounding this first region, a second main electrode of the transistor adjoining the major surface and being separated from the control electrode by a rectifying junction, while at the major surface there is provided a system of signal connections which comprises conductor tracks which are separated from the semiconductor body by an insulating layer, a plurality of these conductor tracks each connecting the first region of the first conductivity type through a diode junction to a further part of the integrated logic circuit, the diode junctions constituting the diodes which are each connected in forward direction in series with the main current path of the transistor, the means for supplying current comprising a supply line for connecting a supply source and means for supplying current from this supply line to the signal input, while a conductive connection at least comprising a load element is arranged between the supply line and the first main electrode of the transistor.

2. Description of the Prior Art

Such an integrated circuit is known from I.E.E.E., *Journal of Solid State Circuits*, Vol. SC-17, No. 4, Aug. '82, pages 687–695, in particular FIG. 9.

In general, the invention relates to logic circuits of, for example, the I²L type (Integrated Injection Logic), the ISL type (Integrated Schottky Logic) and the STL type (Schottky Transistor Logic), in which current supply means are present at the logic input and an internal pull-up connection is present between the first main electrode and the supply line or rail. The transistor may be, for example, a bipolar transistor or a static induction transistor and has a main current path located between a first and a second main electrode and a control electrode for controlling the current flowing through the main current path during operation. In a bipolar transistor, the collector and the emitter constitute the two main electrodes and the base is the control electrode.

The internal pull-up connection may simply comprise a resistor or may be composed, for example, of the series arrangement of a resistor and a diode. It is achieved by means of this connection that the delay time of the logic gate circuit succeeding the gate circuits provided with a pull-up connection is less dependent upon the member of preceding gate circuits connected to the input of this succeeding gate circuit. Furthermore, an improvement of the noise margin is thus obtained. In integrated circuits having a large number of gate circuits, all gate circuits may be provided with an internal pull-up connection. These improvements can be realized practically without increase of the energy dissipation by now distributing the current, which without a pull-up connection was supplied solely to the input, over the input and the pull-up connection so that the overall current per gate circuit remains substantially unchanged.

It will mostly be sufficient when only in the case of gate circuits which form part of a critical signal path and whose input is connected to a comparatively large number of preceding gate circuits, these preceding gate circuits are provided with an internal pull-up connection.

SUMMARY OF THE INVENTION

The present invention has for its object to further improve the described logic circuits having an internal pull-up connection and especially to shorten the delay time.

The invention is based inter alia on the recognition of the fact that this can be achieved in that the voltage between the first and the second main electrode of the transistor is limited in the off-condition to a value which is smaller than the voltage between the supply line and the second main electrode in a manner such that over the whole temperature range in which the gate circuit has to operate in a reliable manner substantially no current can flow from the input of the succeeding gate circuit to the second main electrode of the transistor in the off-condition of the transistor.

According to the invention, an integrated logic circuit of the kind described in the opening paragraph is characterized in that a further connection is provided, which comprises the series arrangement of a Schottky diode and a resistor and which connects the first main electrode to the second main electrode of the transistor, the further connection and the main current path of the transistor being arranged parallel to each other with the same current direction.

In the presence of such a further connection, in the off-condition of the transistor the current flowing through the connection between the supply line and the first main electrode will flow substantially entirely through the further connection, while in the on-condition of the transistor this current flows through the transistor, the voltage at the first main electrode being so small that the further connection is substantially idle.

It has been found that in the integrated circuit according to the invention an effective limitation of the voltage at the first main electrode is attained, whereby in the off-condition of the transistor current continues to flow through the further connection, it is true, as a result of which the dissipation of the gate circuit is slightly increased, but the delay time is reduced considerably. Especially the resistor in the further connection then ensures that over the whole desired temperature range, so also at higher temperatures of, for example, 125° C. to 150° C., a sufficient noise margin remains present. In this connection, the resistors in the pull-up connection and in the further connection are preferably proportioned so that a voltage drop of at least 60 mV occurs across the resistor in the further connection. Very satisfactory results and a higher degree of reliability in operation are attained with a voltage drop of 150 mV or higher.

A great advantage of the present invention is further that the further connection can be co-integrated in a comparatively simple manner, whereby comparatively little additional space at the semiconductor surface is required.

In a particular preferred embodiment of the integrated logic circuit according to the invention, the resistor in the further connection is constituted by a semiconductor zone of the first conductivity type, the Schottky diode being constituted by a rectifier contact on the semiconductor zone.

Advantageously, the semiconductor zone is a second region of the first conductivity type belonging to the group of regions, the first and the second region being mutually separated regions of the first conductivity type, of which only the first region has a more highly doped buried region of the first conductivity type, which extends at and near a part of the boundary between the first region and the common substrate region. By the use of a Schottky diode, in this embodiment, in spite of the absence of a buried layer, there is practically no risk of a parasitic transistor action to the common substrate region. Due to the absence of the buried layer, there is only little space required for the resistor at the semiconductor surface.

In this embodiment, preferably at least a part of a third region of the first conductivity type belonging to the group of regions forms part as a resistor of the pull-up connection, whereby a buried layer is absent in this part of the third region of the first conductivity type, as in the second region of the first conductivity type. The two resistors are then realized in the same form, as a result of which the ratio of their resistance values and hence the value of the limited voltage is comparatively insensitive to small variations in the manufacturing process, which, as is known, may occur in mass production. Moreover, the two resistors will have substantially the same temperature coefficient.

BRIEF DESCRIPTION OF THE DRAWINGS

The invention will be described more fully with reference to an embodiment and the accompanying drawing, in which:

FIG. 1 shows a circuit diagram of the integrated logic circuit according to the invention and FIG. 2 is a schematic plan view of a part of an embodiment of the integrated logic circuit according to the invention, while

DESCRIPTION OF THE PREFERRED EMBODIMENT

Figure 1:
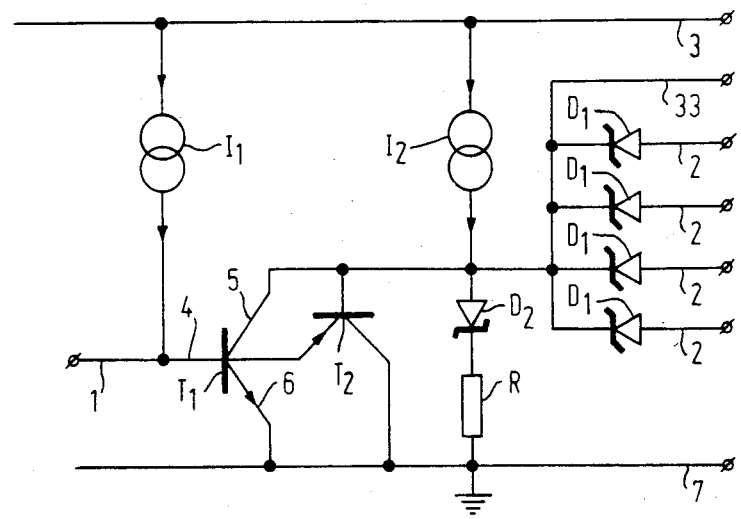
Figure 2:
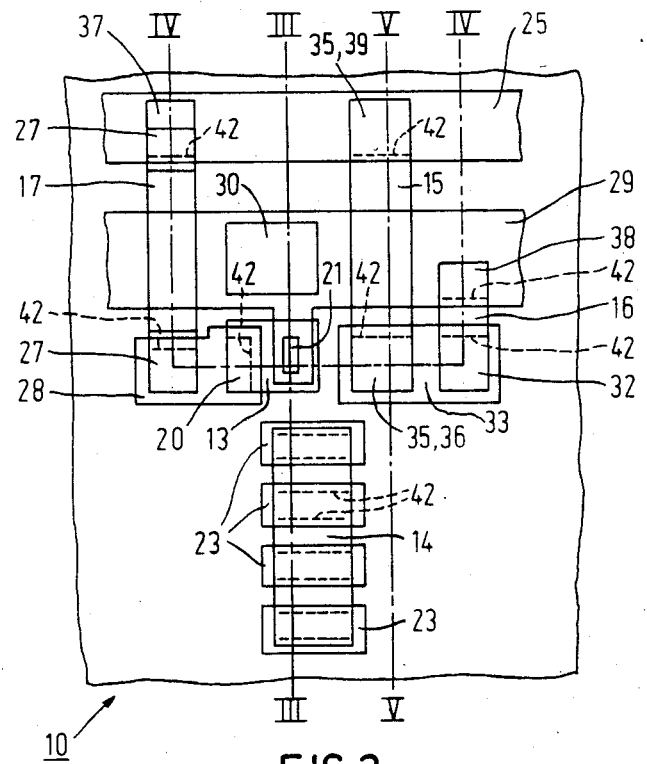
Figure 3:
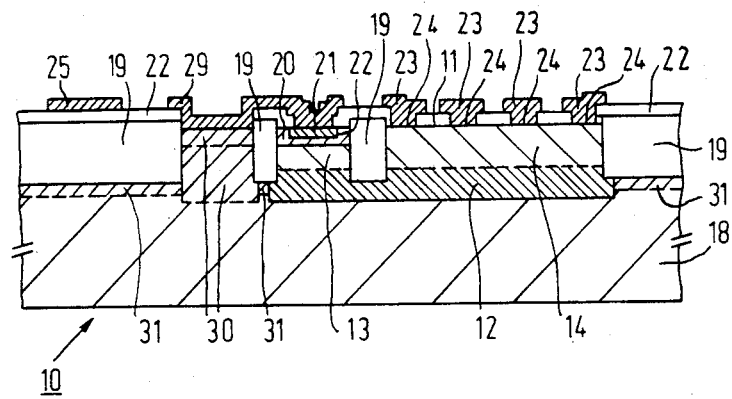
FIG. 3 shows schematically a cross-section of this embodiment taken on the line III—III of FIG. 2.
Figure 4:
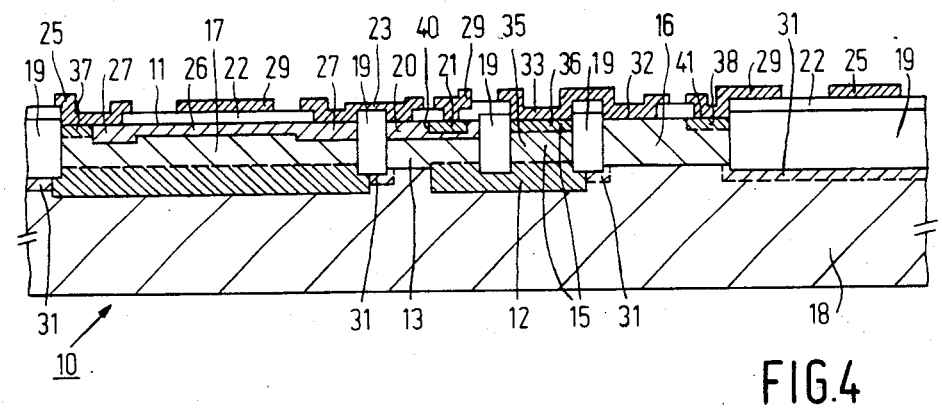
FIG. 4 shows a similar cross-section taken on the line IV—IV of FIG. 2
Figure 5:
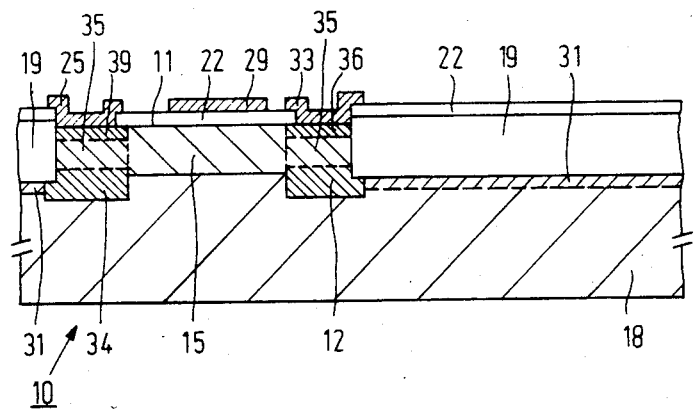
FIG. 5 shows a similar cross-section taken on the line V—V of FIG. 2.

As has been stated, the invention relates to integrated logic circuits of, for example, the $I^2L$ type, the ISL type and the STL type, which have in common that they have a signal input 1 (FIG. 1), which is constituted by the control electrode 4 of a transistor $T_1$ and several signal outputs 2 which are each connected through a diode $D_1$ to a first main electrode 5 of the transistor $T_1$, the signal input 1 being connected to means for supplying current, which comprise a supply line or supply rail 3 for connecting a supply source and means $I_1$ for supplying current from this supply line 3 to the signal input 1, whereby a conductive connection at least comprising a load element $I_2$ is arranged between the supply line 3 and the first main electrode 5 of the transistor $T_1$. Logic circuits of this kind have been described in detail in literature so that their operation need not be described here further. The transistor $T_1$ may be, for example, a bipolar transistor or a static induction transistor and has a main current path lying between a first main electrode 5 and a second main electrode 6 and a control electrode 4 for controlling the current flowing through the main current path during operation. The second main electrode 6 is mostly connected to a point of reference potential, for example, ground. This connection is indicated here by a second supply line or supply rail 7.

In ISL circuits, the transistor $T_1$ is provided with one or more auxiliary transistors which limit the extent to which the transistor $T_1$ becomes saturated in the on-condition. For this purpose, for example, a complementary transistor $T_2$ may be present which in the integrated circuit may have the form of a lateral and/or of a vertical transistor.

In STL circuits, a Schottky diode is connected across the collector-base junction of the transistor $T_1$ which prevents the transistor $T_1$ from becoming saturated.

The means shown in the form of the current source $I_1$ may be realized in the form of a complementary transistor, which then mostly will be in the form of a lateral transistor. Another conventional example has a resistor between the supply lead 3 and the signal input 1.

The load element $I_2$ mostly consists of a resistor or of the series arrangement of a resistor and a diode. The connection between the supply line 3 and the first main electrode 5 constitutes an internal pull-up connection which, when the transistor $T_1$ is switched to the off-condition, assists in raising the potential of the first main electrode to a high value. Through this connection, the capacitances connected to this internal node of the circuit can be charged comparatively rapidly. As a result, the sensitivity of the delay time of the next gate circuit to the fan-in of this next gate circuit is considerably reduced.

As an example of the integrated logic circuit according to the invention, an ISL circuit will now be described with reference to FIGS. 2 to 5, of which FIG. 1 shows the associated circuit diagram and in which the current sources $I_1$ and $I_2$ have the form of resistors.

The integrated logic circuit according to FIGS. 2 to 5 has a semiconductor body 10 with a major surface 11 which is situated on an active side of the semiconductor body 10. The active side of the semiconductor body is the side on which the circuit elements or at least most of the circuit elements of the integrated circuit are provided. A group of regions or islands 13 to 17 of a first conductivity type is disposed on this active side. These regions or islands extend on a substrate region 18 of a second conductivity type which is common to these regions or islands. Each of these regions 13 to 17 is surrounded entirely or substantially entirely by an isolation zone 19 which extends from the major surface 11 into the semiconductor body 10. The regions 13, 14 and 15 are connected to each other by means of a buried layer 12 of the first conductivity type. The regions 16 and 17 are electrically isolated from each other and from the interconnected regions 13, 14 and 15 at least during the operation of the integrated circuit by means of the isolation zone 19. Besides, the integrated circuit may have many other regions of the first conductivity type (not shown) which are isolated from each other and in which similar ISL gate circuits or other circuits or circuit elements may be realized.

A first region 13 of the regions of the first conductivity type forms part of the first main electrode of the transistor $T_1$, in this case the collector of a bipolar transistor. The control electrode or base of the bipolar transistor $T_1$ has a surface zone 20 of the second conductivity type which is situated inside the isolation zone 19 surrounding the first surface region 13. A second main electrode or emitter 21 of the bipolar transistor $T_1$ adjoins the major surface 11 and is separated from the control electrode or base 20 by a rectifying junction 40.

There is disposed at the major surface 11 a system of signal connection which comprises conductor tracks 20 which are separated from the semiconductor body by an insulating layer 22. The insulating layer 22 may be a deposited layer, but may also be obtained by thermal oxidation. In the latter case, the isolation zone 19 in this example also consisting of an insulating material, the insulating layer 22 will be present only on the regions 13 to 17, whereby the thickness of the isolation zone 19 slightly increases during the growth of the layer 22.

Plural conductive tracks 23 connect the first region 13 each through a diode junction 24 to further parts (not shown) of the integrated logic circuit, whereby the diode junctions 24 constitute the diodes $D_1$ of FIG. 1.

The diode junctions 24 are Schottky junctions between a suitable metal or metal-containing material and the region 14. The first region 13 is connected to the region 14 by the buried region 12 of the first conductivity type.

The diodes $D_1$, thus the diode junctions 24, are connected in forward direction in series with the main current path of the transistor $T_1$ constituted by the collector-emitter path.

The means for supplying current to the signal input comprise a supply line 25 and means in the form of a resistor 26, 27 for supplying current to the signal input 28 from the supply line 25. The signal input 28 is a conductor track which connects the resistor 26, 27 to the base of the transistor $T_1$.

Further, a conductive connection comprising at least a load element, which in this example has the form of a resistor constituted by at least a part of the region 15 of the first conductivity type, is present between the supply line 25 and the first main electrode or collector 13, 12 of the transistor $T_1$. On end of the region 15 is connected to the supply line 25, while the other end of the region 15 forms part of a collector connection for the transistor which also comprises the conductor track 33.

The emitter 21 of the transistor $T_1$ is connected to a second supply line 7, which is constructed as the conductive track 29. This conductive track 29 is also connected to the substrate region 18 by means of a surface region of the second conductivity type 30.

The complementary transistor $T_2$ of FIG. 1 is constituted by the base 20 and the collector region 13 of the transistor $T_1$ and the substrate region 18, which constitute the emitter, the base and the collector, respectively, of the transistor $T_2$. In this connection, the surface region 30 is provided close to the transistor $T_1$. The collector series resistance of the transistor $T_2$ thus remains limited. A favorable influence on this series resistance is also exerted by the presence of usual channel stoppers 31 of the second conductivity type below the isolation zone 19 formed from an insulating material.

As is usual in ISL circuits having a vertical complementary transistor $T_2$, the buried layer 12 extends only below a part of the base zone 20, i.e. only below the active part comprising the emitter zone 21. No buried layer 12 is present below the remaining part of the base zone 20 joining the active part. In this part of the semiconductor structure, an effective transistor action to the substrate region 18 obtained, by which the extent to which the transistor $T_1$ can become saturated is limited.

According to the invention, a further connection is present, which comprises the series arrangement of a Schottky diode $D_2$ and a resistor R (FIG. 1) and which connects the first main electrode 5 to the second main electrode 6 of the transistor $T_1$, whereby the main current path of the transistor $T_1$ and the further connection are connected parallel to each other with the same current direction. In other words, if the (positive) current direction in the main current path of the transistor $T_1$ is such that the current flows from the collector to the emitter, the diode $D_2$ is arranged so that the current direction in the further connection, thus the forward direction of the Schottky diode $D_2$, is also such that the current flows from the collector to the emitter of the transistor $T_1$.

The Schottky diode $D_2$ is constituted in the integrated circuit shown in FIGS. 2 to 5 by the Schottky junction 32 between the conductive track 33 connected to the collector of the transistor $T_1$ and the region 16 of the first conductivity type. This Schottky junction 32 is situated at one end of the region 16, while the other end of the region 16 is connected to the conductive track 29 and through this conductive track 29 to the second main electrode or emitter 21 of the transistor $T_1$. The isolated region 16 constitutes the resistor R connected in series with the Schottky diode $D_2$.

The further connection comprising the diode $D_2$ and the resistor R has the advantage that in the on-condition of the transistor $R_1$ no current flows through the diode $D_2$ and the resistor R and that in the off-condition of the transistor $T_1$ the voltage at the collector of the transistor $T_1$ is effectively limited, whereby even at higher temperatures no current is extracted from successive gate circuits.

In the on-condition of the transistor $T_1$, the collector voltage is so low that the diode $D_2$ cannot conduct. In the off-condition of the transistor $T_1$, however, the limitation of the collector voltage by means of the diode $D_2$ at higher temperatures may readily give rise to problems. The fact should be taken into account that, viewed from the input of the succeeding gate circuit, the diodes $D_1$ and $D_2$ are connected in series and together have a considerably larger temperature coefficient than the emitter-base junction at the input of the succeeding gate circuit. The resistor R makes certain that even higher temperature of 125° to 150° C. the collector voltage remains sufficiently high to practically prevent current from being extracted from the succeeding circuits.

The lower limit of the resistance value of the resistor R is determined especially by the extent reliable operation is to be ensured and by the noise margin which is still desired at high temperature. This lower limit further depends upon the chosen supply voltage and the diode forward voltage of the diode $D_2$. The resistor R is preferably chosen so that during operation in the off-condition of the transistor $T_1$ a voltage drop of at least 60 mV occurs across it. A higher degree of certainty that even at very high temperatures no current loss occurs is obtained with a voltage drop across the resistor R of at least 150 mV.

If the supply voltage at the supply line 3 is, for example, 1.5 V and if the diode $D_2$ has at room temperature a diode forward voltage of, for example, about 480 mV, a voltage drop of, for example, 300 mV across the resistor R means that the voltage swing at the collector of the transistor $T_1$ is approximately halved by the provision of the further connection. This is of special importance because of the base-collector capacitance of the transistor $T_1$ which due to the Miller effect during change-over has an excessively large influence. Due to the decreased voltage swing at the collector of the transistor $T_1$, the contribution to the delay time of this base-collector capacitance is considerably reduced. Additionally, the capacitance of the collector of the transistor $T_1$ to ground plays a part. Inter alia the capacitances of the surface regions 13 and 14 to the substrate contribute to this capacitance. In this connection, it is favorable that a Schottky diode is used in the further connection path. As a result, comparatively little additional capacitance to ground is added to the node of the logic circuit constituted by the collector of the transistor $T_1$. If the diode would be realized in the further connection path in the form of the emitter-base diode of an additional transistor, whose base-collector junction is short circuited, the collector-substrate capacitance of this additional transistor is added to the capacitance of the said node point. The improvement achieved with the further connection path therefore becomes smaller.

The base-collector junction is less suitable as a diode in connection with the comparatively large charge storage occurring therein. Finally, the use of a transistor structure instead of the Schottky diode proposed moreover has an unfavorable influence on the manufacturing yield of the integrated circuit.

The resistor in the further connection path is preferably constituted by a semiconductor zone 16 of the first conductivity type, the Schottky diode being constituted by a rectifying contact 32 on this semiconductor zone 16. With a further connection of this form that can be integrated in a comparatively simple manner, the rectifying contact 32 of the semiconductor zone 16 is connected through one of the conductive tracks, i.e. the conductive track 33, to the first main electrode 12, 13, 15 of the transistor, whereby at a certain distance from the rectifying contact 32 a non-rectifying contact 41 is provided on the semiconductor zone 16, which contact is conductively connected through the conductive track 29 to the second main electrode 21 of the transistor. In the example, the non-rectifying contact is obtained by means of a more highly doped connection region 38 which is provided in the semiconductor zone 16.

A very favorable embodiment, especially for gate circuits having a low dissipation and a comparatively high resistance value, is that in which the semiconductor zone of the resistor is a second region 16 of the regions 13 to 17 of the first conductivity type, the first region 13 and the second region 16 being mutually separated regions, of which only the first region has a more highly doped buried region 12 of the first conductivity type, which extends at and in the vicinity of a part of the boundary between the first region 13 and the common substrate region 18. The fact is then utilized that the diode in the further connection is a Schottky diode 32. In this diode operated in forward direction, in spite of the absence of a buried region in the region 16, practically no parasitic transistor action to the common substrate region 18 will occur.

Advantageously, the resistor in the internal pull-up connection is realized in the same form, whereby at least a part of a third region 15 of the first conductivity type constitutes the last-mentioned resistor and a more highly doped buried layer is absent in this part, just like in the second region 16. The resistor in the internal pull-up connection and the resistor R then have practically the same temperature coefficient and moreover the ratio of their resistance values will be comparatively insensitive to small variations in the manufacturing process. The value of the voltage at the first main electrode of the transistor limited by the further connection path is then little sensitive to variations in the resistance values and the temperature of the resistors.

The example of FIGS. 2 to 5 can be manufactured wholly in a manner usual in the semiconductor technique, by means of known techniques, such as epitaxy, diffusion and/or implantation, local oxidation and deposition of insulating and/or conductive layers.

For example, the starting member may be a p-type silicon body having a resistivity of 20 to 30 $\Omega$.cm and <111>- orientation. For the buried layer, for example, Sb may be implanted. The sheet resistance of the buried layer is about 30$\Omega$.

Subsequently, an n-type epitaxial layer having a thickness of about 1.2 $\mu$m and a resistivity of about 0.3 $\Omega$.cm can be deposited on the p-type body.

The isolation zone 19 can be obtained by local oxidation by means of a mask composed of a thin oxide layer and a silicon nitride layer. After openings have been provided in this masking layer, silicon can be etched and boron can then be introduced for the channel stoppers 31 by means of implantation. Subsequently, the semiconductor body is heated in an oxidizing atmosphere until isolation zones having a thickness of 1.5 $\mu$m are obtained which are sunk into the semiconductor body over practically their whole thickness. The semiconductor body 10 then has a number of n-type islands 13 to 17 which extend on a p-type substrate region 18 common to these islands.

For the formation of the p-type surface region 30, boron can be introduced by implantation. After a thermal treatment of, for example, about 7.5 hours at about 1000° C. in a nitrogen atmosphere, the boron will be diffused to a sufficient depth to ensure a good contact with the substrate region 18. The sheet resistance of the p-type surface region is about 80 $\Omega$.

The connection regions 35 can also be obtained by implantation and diffusion. As a dopant use may be made, for example, of phosphorous and the sheet resistance of these connection regions 35 is, for example, 50 to 60 $\Omega$.

The base zone 20 and the connection regions 27 of the resistor 26, 27 are doped, for example, with boron and have, for example, a sheet resistance of about 500 $\Omega$. The base-collector junction lies, for example, at a depth of about 0.5 $\mu$m.

The resistance region 26 of the resistor 26, 27 can be doped with boron by means of implantation. The sheet resistance can be about 2 k$\Omega$ and the pn-junction formed with the n-type region 17 can be located at a depth of about 0.5 $\mu$m.

The deposited insulating layer 22 may consist, for example, of a double layer of silicon oxide and silicon nitride. All the further openings required can be provided in this double layer at the same time. By means of a photolacquer layer pattern, all the openings, except those in which the emitter doping is provided, are then covered. The emitter doping, for example As, is implanted. The sheet resistance is, for example, 25 to 30 Ω and the emitter-base junction lies, for example, at a depth of about 0.25 μm. Simultaneously with the emitter zone 21, a collector contact region 36, an n-type connection region 37 for the surface region 17, an n-type connection region 38 for the resistor 16 and an n-type connection region 39 for the resistor 15 can be formed.

After the photolacquer layer pattern has been removed and the openings have been cleaned, a suitable material for the formation of Schottky junctions can be provided in a usual manner. In the example, a layer consisting of Pt and Ni and having a thickness of about 25 nm was used. After the formation of silicide in the openings at about 475° C., the redundant parts of this PtNi layer were removed. The barrier height of the Schottky junctions obtained is about 0.78 eV.

The conductive tracks 23, 25, 28, 29 and 33 may consist, for example, of a TiW layer having a thickness of about 0.1 μm and an Al layer having a thickness of 0.6 to 0.7 μm. A further insulating layer (not shown) of, for example, silicon oxide may be formed over these conductive tracks, in which layer contact openings are provided. Subsequently, a second pattern of conductive tracks (not shown) for electrical connection of the gate circuit shown with other parts of the integrated circuit not shown may then be formed on this insulating layer and in the contact openings. For example an Al layer having a thickness of about 1.5 μm may be used for this second pattern of conductive tracks.

Finally, a protecting, passivating insulating layer of, for example, silicon oxide and/or silicon nitride may be provided on the second pattern of conductive tracks and the integrated circuit may be finished in a usual manner, for example, by mounting in a suitable envelope.

In the mask masking against oxidation, which is used to provide the isolation zone 19, the region 13 may have dimensions of, for example, 16 μm×12 μm. The region 15 is, for example, 48 μm×10 μm. The region 16 may have a length of about 20 μm and a width of about 8 μm. The region 17 is, for example, 48 μm×8 μm and the dimensions of the region 14 are, for example, 37.5 μm×13 μm. The surface region 30 for the connection of the substrate region 18 is, for example, 15 μm×12 μm. In the actual semiconductor structure, the said dimensions will be smaller due to the etching treatment of the silicon body and the growth of the oxide of the isolation zone 19.

The opening in the insulating layer 22 for the emitter zone 21 has a length of, for example, about 6 μm and a width of about 2.5 μm. Other openings in the insulating layer, as far as their edge does not coincide with the boundary of regions or islands 13 to 17, are indicated in FIG. 1 by broken lines 42. The width of the openings for the Schottky diodes $D_1$ is, for example, about 4 μm and the length of the opening for the Schottky diode $D_2$ is, for example, about 9 μm.

In the example described, the resistors 26 and 15 have a value of about 12 k Ω and the value of the resistor R—the region 16—is about 4.5 k Ω. At a supply voltage of about 1.5 V and an average current $(I_1+I_2)$ per gate circuit of about 125 μA, the delay time may then be about 1 nsec. This delay time varies up to a fan-in of 7 to 8 by less than about 10 %. The product of the delay time τ and the dissipation D is then about 0.19 pJ. If the further connection path is omitted, the delay time will be about 1.3 nsec, the conditions being otherwise the same.

The present invention is not limited to the embodiment described. Within the scope of the invention, many modifications are possible for those skilled in the art both with respect to the construction of the integrated circuit and with respect to the described method of manufacturing same. For example, the indicated conductivity types may be interchanged, in which event the polarities of the applied voltages are also interchanged. This means inter alia also that the current direction in the means $I_1$ for supplying current to the signal input 4, in the internal pull-up connection comprising the impedance element $I_2$ and in the further connection comprising the diode $D_2$ and the resistor R, is reversed. The expression "means for supplying current" is to be interpreted in such a wide sense that it includes both current directions.

Also other materials than the indicated PtNi, such as Pt or Ti or TiW, may be used for the Schottky diodes. To those skilled in the art various examples are known from literature of materials with which suitable Schottky junctions can be formed with n-type and/or p-type semiconductor material. Within the scope of the invention, Schottky junctions are to be understood to means not only pure metal-semiconductor junctions, but also, for example, metal-silicide-semiconductor junctions and in general all the suitable rectifying junctions that can be obtained with the aid of a metal-containing layer at the semiconductor surface or in the immediate proximity thereof, whereby, for example, ion implantation may also be used to influence or to adapt the properties of the diode. In a diode of this kind, storage of charge will take place to a comparatively little extent and the forward voltage across such a Schottky diode in the conductive state will be smaller than the corresponding voltage across a conducting pn-junction in the substantially monocrystalline semiconductor body used in the integrated circuit. Furthermore, the temperature coefficient of such a diode is comparatively low.

Preferably, the diodes $D_1$ and $D_2$ have the same construction. In STL circuits, in which Schottky diodes of different barrier heights are required, the diode $D_2$ preferably has the same construction as the diode having the largest barrier height. Furthermore, in STL circuits comprising a diode $D_2$ and a resistor R, with an increase in temperature, the noise margin will mostly become too low sooner than in comparable ISL circuits so that the presence of a sufficiently large resistor R in STL circuits is of particular importance.

In ISL circuits, besides or instead of the complementary auxiliary transistor $T_2$ described, an auxiliary transistor of the same type as the transistor $T_1$ may also be used. For example, there is then provided in the base zone 20 simultaneously with the emitter zone 21 a further n-type surface region which is short-circuited with the base zone 20 by means of the conductive pattern 28.

Instead of the separation by means of isolation zones 19 obtained by local oxidation, other dielectric isolation techniques may be used, such as V-grooves or grooves filled with insulating and/or polycrystalline semiconductor material. The integrated circuit may further be realized with the more conventional pn-isolation.

Instead of silicon, other semiconductor materials, such as germanium or $A^{III}B^V$ compounds, may be used. Also for the insulating layer or layers, other materials than those mentioned above, such as aluminum oxide or silicon oxynitride, may be used. Instead of being made of Al or TiW-Al, the conductive tracks may consist wholly or in part of other suitable materials, such as polycrystalline semiconductor material and/or metal silicide.

At the input of the logic gate circuit, instead of a resistor 26, 27 obtained by implantation, also a resistor of the same or a comparable construction as that of the resistor 15 in the pull-up connection and/or the resistor 16 connected in series with the diode 32 may be used.

In the embodiment, the diodes $D_1$ are provided in the form of junctions 24 on the collector region 13 or at least on a surface region or island 14 directly connected thereto in the semiconductor body. If required, however, the diodes $D_1$ may also be situated in a separate island which is located at a certain distance from the transistor $T_1$ and which is connected through the collector connection 33 and a conductive track to the collector of the transistor $T_1$.

What is claimed is:

1. An integrated logic circuit having a signal input formed by a control electrode of a transistor and plural signal outputs each coupled through a diode to a first main electrode of the transistor, the signal input being connected to means for supplying current, which integrated logic circuit comprises a semiconductor body having a major surface located on an active side of the semiconductor body, a group of regions of a first conductivity type being present on this active side of the semiconductor body, which regions extend on a substrate region of a second conductivity type common to these regions, each of the regions of the first conductivity type being surrounded by an isolation zone which extends from the major surface into the semiconductor body and by means of which at least a number of these regions are isolated from each other at least during operation of the integrated logic circuit, whereby a first region of the first conductivity type belonging to the group of regions forms part of the first main electrode of the transistor and the control electrode of the transistor has a surface zone of the second conductivity type which is situated inside the isolation zone surrounding this first region, a second main electrode of the transistor adjoining the major surface and being separated from the control electrode by a rectifying junction, while at the major surface there is provided a system of signal connections which comprises conductive tracks which are separated from the semiconductor body by an insulating layer, a plurality of these conductive tracks each connecting the first region of the first conductivity type through a diode junction to a further part of the integrated logic circuit, the diode junctions constituting the said diodes which are each connected in forward direction in series with the main current path of the transistor, the means for supplying current comprising a supply line for connecting a supply source and means for supplying current from the supply line to the signal input, while a conductive connection at least comprising a load element is arranged between the supply line and the first main electrode of the transistor, characterized in that a further connection is provided, which comprises the series arrangement of a Schottky diode and a resistor and which connects the first main electrode to the second main electrode of the transistor, the further connection and the main current path of the transistor being arranged parallel to each other with the same current direction.

2. An integrated logic circuit as claimed in claim 1, characterized in that during operation a voltage drop of at least 60 mV occurs across the resistor in the further connection.

3. An integrated logic circuit as claimed in claim 2, characterized in that the voltage drop is at least 150 mV.

4. An integrated logic circuit as claimed in claim 1, 2 or 3, characterized in that the resistor in the further connection comprises a semiconductor zone of the first conductivity type, the Schottky diode being formed by a rectifying contact on this semiconductor zone.

5. An integrated logic circuit as claimed in claim 4, characterized in that the rectifying contact of the semiconductor zone is connected through one of the said conductive tracks to the first main electrode of the transistor, a non-rectifying contact being provided on the semiconductor zone at a certain distance from the rectifying contact, which non-rectifying contact is conductively connected to the second main electrode of the transistor.

6. An integrated logic circuit as claimed in claim 4, characterized in that the semiconductor zone is a second region of the first conductivity type belonging to the group or regions, the first and the second region being mutually separated regions of the first conductivity type, of which only the first region has a more highly doped buried region of the first conductivity type which extends at and in the vicinity of a part of the boundary between the first region and the common substrate region.

7. An integrated logic circuit as claimed in claim 6, characterized in that at least a part of a third region of the first conductivity type belonging to the group of regions forms part as a resistor of the connection between the supply line and the first main electrode of the transistor, whereby of the first and the second regions of the first conductivity type and the said part of the third region of the first conductivity type only the first region of the first conductivity type has a more highly doped buried region of the first conductivity type.

* * * * *